US006609230B1

(12) United States Patent
Li

(10) Patent No.: US 6,609,230 B1
(45) Date of Patent: Aug. 19, 2003

(54) METHOD FOR DESIGN VERIFICATION USING MODULAR TEMPLATES OF TEST BENCHES

(76) Inventor: Zhe Li, 1 Argent Dr., Poughkeepsie, NY (US) 12603

( * ) Notice: Subject to any disclaimer, the term of this patent is extended or adjusted under 35 U.S.C. 154(b) by 88 days.

(21) Appl. No.: 09/818,099

(22) Filed: Mar. 27, 2001

Related U.S. Application Data

(63) Continuation-in-part of application No. 09/257,148, filed on Feb. 24, 1999, now Pat. No. 6,339,837, and a continuation-in-part of application No. 09/531,633, filed on Mar. 21, 2000.
(60) Provisional application No. 60/192,672, filed on Mar. 28, 2000.

(51) Int. Cl.[7] .............................................. G06F 17/50
(52) U.S. Cl. .................................. 716/5; 716/2; 716/4
(58) Field of Search ........................................ 716/1–18

(56) References Cited

U.S. PATENT DOCUMENTS

| | | | |
|---|---|---|---|
| 5,465,216 A | 11/1995 | Rotem et al. | 716/5 |
| 5,493,508 A | 2/1996 | Dangelo et al. | 716/5 |
| 5,513,122 A | 4/1996 | Cheng et al. | 716/5 |
| 5,615,137 A | 3/1997 | Holzmann et al. | 703/17 |
| 5,740,086 A * | 4/1998 | Komoto | 702/120 |
| 5,752,000 A | 5/1998 | McGeer et al. | 703/14 |
| 5,784,593 A | 7/1998 | Tseng et al. | 703/15 |
| 5,809,283 A | 9/1998 | Vaidyanathan et al. | 703/16 |
| 5,859,962 A | 1/1999 | Tipon et al. | 714/33 |
| 5,926,622 A | 7/1999 | Hardin et al. | 714/33 |
| 5,937,183 A | 8/1999 | Ashar et al. | 703/14 |
| 6,026,222 A | 2/2000 | Gupta et al. | 716/15 |
| 6,059,837 A | 5/2000 | Kukula et al. | 703/23 |
| 6,074,426 A | 6/2000 | Baumgartner et al. | 703/13 |
| 6,083,269 A * | 7/2000 | Graef et al. | 703/14 |
| 6,110,218 A | 8/2000 | Jennings | 703/22 |
| 6,141,630 A * | 10/2000 | McNamara et al. | 703/14 |
| 6,141,633 A | 10/2000 | Iwashita et al. | 703/15 |
| 6,182,258 B1 | 1/2001 | Hollander | 714/739 |
| 6,192,505 B1 | 2/2001 | Beer et al. | 716/2 |
| 6,195,616 B1 | 2/2001 | Reed et al. | 702/119 |
| 6,219,809 B1 | 4/2001 | Noy | 714/724 |

OTHER PUBLICATIONS

D. Wang et al "Formal Property Verification by Abstraction Refinement with Formal, Simulation and Hybrid Engines" Proceedings of 38th Design Automation Conference, Jun. 2001, pp. 35–40, IEEE, USA.
A. Kolbl et al "Symbolic RTL Simulation" Proceedings of 38th Design Automation Conference, Jun. 2001, pp. 47–52, IEEE, USA.
J. Dushina et al "Semi–Formal Test Generation with Genevieve" Proceedings of 38th Design Automation Conference, Jun. 2001, pp. 617–622, IEEE, USA.
C. Pixley et al "Commercial Design Verification: Methodology and Tools" Proceedings of IEEE International Test Conference, 1996, pp. 839–848, IEEE, USA.
K. A. Kumar; B. Petrasko "Designing a Custom DSP Circiut Using VHDL" IEEE Micro, vol. 10, No. 5, Oct. 1990, pp. 46–53, IEEE, USA.
J. L. Carter et al "Restricted Symbolic Evaluation is Fast and Useful" Proceedings of International Conference on Computer–Aided Design, 1989, IEEE, USA.
N. C. E. Srinivas; V. D. Agrawal : Formal Verification of Digital Circuits Using Hybrid Simulation IEEE Circuits and Design Magazine, Jan. 1988, pp. 19–27, IEEE, USA.

* cited by examiner

Primary Examiner—Minh Nguyen

(57) ABSTRACT

A method for functional verification of a digital circuit design in a hardware description language, using a multi-level test bench template to drive the design and to check the design's behavior. Wild cards in the design and in the test bench template are used to provide constraints. A hybrid analysis process is applied as well as symbolic analysis, exhaustive simulation and pseudo-random simulation. A similar method is also used for functional coverage analysis in functional verification.

19 Claims, 6 Drawing Sheets

METHOD FOR DESIGN VERIFICATION USING MODULAR TEMPLATES OF TEST BENCHES

CROSS-REFERENCE TO RELATED APPLICATIONS

This application is entitled to the benefit of provisional patent application No. 60/192,672, titled Method for Design Verification Using Modular Templates of Test Benches, and filed on Mar. 28$^{th}$, 2000, the contents of which are herein incorporated by reference.

This is a continuation-in-part of patent application Ser. No. 09/257,148, now U.S. Pat. No. 6,339,837, titled Hybrid Method for Design Verification, and filed on Feb. 24$^{th}$, 1999, the contents of which are herein incorporated by reference.

This is a continuation-in-part of patent application Ser. No. 09/531,633, titled Method for Conditional Tautology Checking, and filed on Mar. 21$^{st}$, 2000, the contents of which are herein incorporated by reference.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

This invention relates to electronic design automation, specifically to verification of electronic circuit designs' functional correctness using a computer program.

A digital circuit includes gates, memory elements and wires connecting the gates and the memory elements. When people make a large digital circuit design, they write the design in a hardware description language. IEEE standards 1076 and 1364 are 2 well-known hardware description languages. Identifiers in a hardware description language are used to represent wires and memory elements in circuits. An identifier can be called a wire if its value at any circuit operation time does not directly depend on its value at a previous circuit operation time. An identifier can be called a memory element if its value at a circuit operation time is simply its value at a previous circuit operation time. For the purpose of avoiding erroneous chips, they have to verify that the design is functionally correct before transforming the design into a format used for fabricating the chip. As chips growing larger and larger, the existing verification methods are no longer able to guarantee their functional correctness.

A method to verify functional correctness is to use a logic simulator, and this is called directed simulation in the following discussion. The simulator reads the circuit design and a set of stimulus values for the inputs of the circuit design. The simulator then computes the circuit design's response behavior. The circuit design's functional correctness is decided by comparing the computed response behavior with the expected behavior. The description of both the stimulus values and the correctness decision logic is generally called a test bench. The identifiers in this description can also be called wires or memory elements as in a hardware description language. In fact, this description is usually in a hardware description language.

The values used for a logic simulator normally include 0 and 1. They sometimes include a high impedance value, which is usually called Z. Other values may also be included in some cases to indicate values between 0, 1 and Z, and they are often called values of different strengths. A special value, usually called X, is sometimes included to indicate an unknown value (or an abnormal value). How gates and memory elements respond to these values other than 0 and 1 is defined to be meaningful in most cases, but it may not work meaningfully for all cases. In many cases, the gates or memory elements simply produce X values for such difficult cases. If a signal does not get any value, its default value is obtained according to some predefined rules.

This method using logic simulators can handle nearly all cases but it is not efficient because too many simulation runs are required for a large design and a lot of computation in the simulator is repeated too many times. The stimulus values can be automatically generated by a pseudo-random number generator or they can be generated by exhaustively enumerating through all possible combinations, but these generation approaches do not solve these efficiency problems.

Another method to verify functional correctness is to analyzing the design against an assertion (or a property). It usually involves transforming the design and the assertion from one representation to another before analyzing whether the design satisfies the assertion. The analysis generally treats the design and the assertion as equations of Boolean variables. The analysis can be done in several different ways, which are usually called formal methods or symbolic methods. In the following discussion, they are called symbolic analysis processes. These processes are highly efficient but they can be applied to only a limited subset of the real world verification problems. This limitation is the result of the great computational complexities of general verification problems, and these formal or symbolic methods are used to find complete solution to these complex problems.

There are needs for incomplete and efficient solutions to the functional verification tasks. Because of the incompleteness of these solutions, convenient and flexible methods are needed for users to specify subsets of these verification tasks. These methods should also make it easy for users to adjust these subsets. They are made possible by patent applications Ser. No. 09/257,148 titled Hybrid Method for Design Verification and Ser. No. 09/531,633 titled Method for Conditional Tautology Checking together.

BRIEF SUMMARY OF THE INVENTION

The present invention provides a method for verifying a digital circuit design in a hardware description language, using a test bench template and a verification process. A test bench feeds values to the signals in the circuit design and reads the response behavior from the circuit design. The test bench template is an incompletely specified test bench which includes a checking function and may feed no values, X values and Z values in addition to 0 values and 1 values to certain signals. The verification process treats no values and X values as changing wild cards. A changing wild card can change between 0 and 1 at any circuit operation time in simulation. The verification process completely covers all possible permutations of 0/1 binary values for these changing wild cards.

This method works with both logic simulation and formal (or symbolic) methods. It also allows making trade-off decisions both manually by users and automatically by the verification process. Therefore this method makes it easy to optimize the solutions to the verification tasks.

DETAILED DESCRIPTION OF THE INVENTION

A method for verifying a digital circuit design in a hardware description language, using test bench templates, is disclosed.

Figure 1:
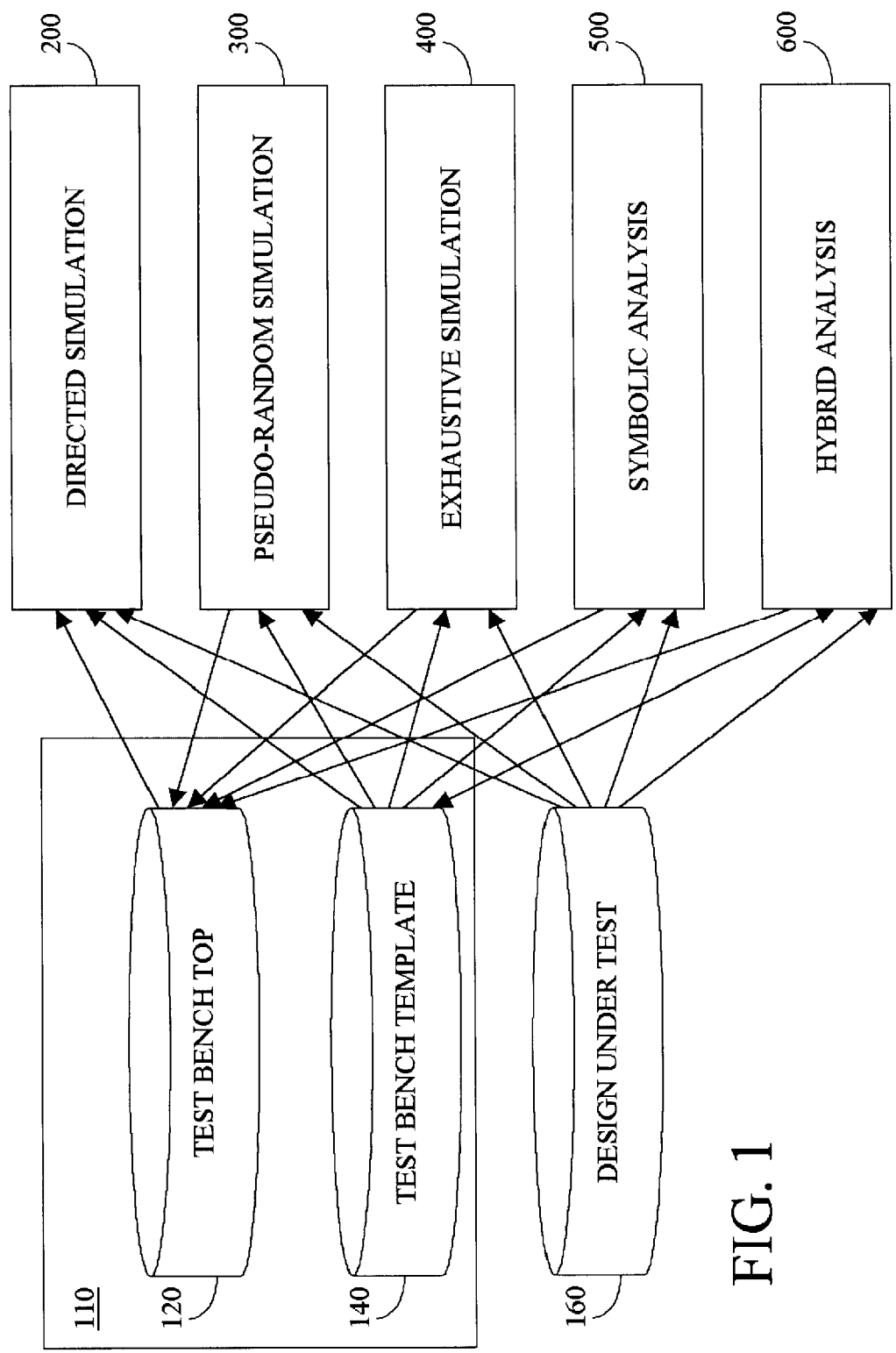
FIG. 1 illustrates, in block diagram form, a hierarchy of modular test bench with a test bench template and five verification processes of its applications.

FIG. 1 illustrates a test bench 110 comprising a test bench top 120 and a test bench template 140. Test bench 110 is used to verify a design under test 160. It is known in the prior art that a process of directed simulation 200 takes test bench 110 and design under test 160 as inputs. In preferred embodiments of the present invention, a process of pseudo-random simulation 300, a process of exhaustive simulation 400, a process of symbolic analysis 500, or a process of hybrid analysis 600 take test bench template 140 and design under test 160 as inputs and optionally generate test bench top 120 as output. This output can be used for debugging the causes of the reported problems from these processes. Hybrid analysis 600 can also generate test bench template 140 as output, and this output can be used for post-processing analysis of functional coverage (i.e. whether certain conditions are involved in hybrid analysis 600 or not).

Design under test 160 describes a digital circuit, which comprises wires and circuit components. Test bench 110 provides values to some of these wires, and the values of a wire can be different for different clock cycles. Assuming the circuit is synchronous, the circuit operation time In simulation is counted in clock cycles. Depending on the hardware description language, the values from test bench 110 may override the connections within design under test 160, which can be used to simulate only a part of design under test 160. Test bench template 140 provides some of these wire values, and test bench top 120 provides some other wire values. It is possible for values from test bench top 120 to override values from test bench template 140. It is also possible for test bench template 140 to provide values of a wire for some clock cycles and for test bench top 120 to provide values of this wire for other clock cycles because any part of test bench 110 can include descriptions of any circuit components. Some of these values may be only provided in test bench top 120.

The clock signals (not shown) may be identified based on information in design under test 160, test bench 110 or other interfaces to hybrid analysis 600, symbolic analysis 500, exhaustive simulation 400, pseudo-random simulation 300 or directed simulation 200. These other interfaces may include command line options, additional input files, interactive inputs or simply default conventions. The clock signals may or may not explicitly appear in these descriptions, and it is possible that a clock signal is implied by the delay values. The clock frequencies can be calculated from oscillators or from other delay values in any of these descriptions. When a clock signal is implied, its cycle time simply has to be a unit of all delay values so that all these delay values can be implemented as the delays between events in the synchronous logic based on this clock signal.

Design under test 160 may also include memory elements. The initial value of a memory element may be not specified, or may be specified in design under test 160, in test bench template 140, or in test bench top 120.

The values of the wires for various clock cycles and the initial values of the memory elements can be fed by some structure in test bench 110. This is a way to specify constraints on these values or dependencies among these values. The feeding structure may depend on the circuit behavior of design under test 160, and it may include various constant values or dangling inputs as design under test 160 may. A dangling input usually has a predetermined default value as defined by the hardware description language. Each of these constant values and default values can be 0, 1 or others. If the value is neither 0 nor 1, it sometimes may be interpreted as 0 or 1. If it is neither 0 nor 1 and it is not interpreted as 0 or 1, it is treated as a series of wild cards. Hybrid analysis 600, symbolic analysis 500, exhaustive simulation 400 and pseudo-random simulation 300 are free to interpret a wild card value as either 0 or 1. A series of wild cards consists of a different wild card for each different circuit operation time in simulation. An X (or unknown, don't-care, uninitialized, undefined, random, etc.) value or a default value of a dangling input is generally treated as a series of wild cards in a preferred embodiment. A Z (high impedance) value may be interpreted as 0 in tri-state circuits if the tri-state connections are treated as wired OR.

Test bench 110 can be hierarchical, and it can include one or more levels. Each level treats all lower levels similar to treating parts of design under test 160. Each level becomes a module inside a module at a higher level. Each of these levels can be in test bench template 140 or test bench top 120. It is a part of test bench template 140 if it is used as input to pseudo-random simulation 300, exhaustive simulation 400, symbolic analysis 500, or hybrid analysis 600. It is a part of test bench top 120 otherwise.

Each level of test bench 110 may extend the structure feeding the values of the wires and the initial values of memory elements. This extension may override some values in the feeding structure by adding more connections and more components. It therefore adds more constraints (or dependencies) although it may also removes or replaces constraints (or dependencies). In this way, each level can modify the coverage (the constrained space of these values) of test bench template 140. A narrower coverage usually results in a shorter turnaround time of a single run and possibly a lower efficiency in the overall solution because it divides the solution into several runs in a possibly imperfect way.

A signal's value is its default value if it does not get any value otherwise. This default value is overridden if a connection from another module is added to feed this signal. Usually the connections between different modules are through the modules' interfaces (I/O ports), and a hardware description language may also allow such connections directly without going through any module's interface. Similarly one module may provide initial values to memory elements in another module if allowed in the language. If rules are defined in the hardware description language, any values (including wild cards) can be overridden with the added modules.

Each level of test bench 110 may include a different checking function for deciding whether the circuit behavior of design under test 160 is correct. Each level can also treat the output of the checking function at a lower level as a part of the circuit behavior, or it may check the circuit behavior with an entirely new function while ignoring the checking function at the lower level. A higher level may also completely rely on the checking function at a lower level. At least one such checking function must exist in test bench 110. A checking function may also depend on the behavior of the structure feeding values into design under test 160. Because this specification ignores syntax details, the term function means a block of logic with an output.

If a level of test bench 110 includes multiple checking functions, these checking functions are always equivalent to one checking function because the circuit behavior of design under test 160 is correct only if all checking functions indicate so.

Any checking function can be used for functional coverage checking instead of correctness checking. When used for functional coverage checking, the output of a checking function indicates whether the given condition can never be true under the constraints or dependencies provided in test bench 110. When used for functional coverage checking, multiple checking functions are not always equivalent to one checking function because the truth of one condition generally does not imply the truth of another condition. Therefore, multiple checking functions need to be processed one at a time if used for functional coverage checking.

This checking function in use (not shown) must be identified to hybrid analysis 600, symbolic analysis 500, exhaustive simulation 400 or pseudo-random simulation 300. It can be identified as an expression or a signal in a specific module, and this identification can be communicated via command line options, additional input files, interactive inputs, simply default conventions, etc. When identifying the checking function in use, it is also needed to identify (again via command line options, additional input files, interactive inputs, simply default conventions, etc.) both the expected value of this function and when in the circuit operation time in simulation (e.g. always, only at the end, or at a specified time) this value is expected. The end point of the circuit operation time in simulation may be identified based on information in design under test 160, test bench 110 or other interfaces to hybrid analysis 600, symbolic analysis 500, exhaustive simulation 400, pseudo-random simulation 300 or directed simulation 200. These other interfaces may include command line options, additional input files, interactive inputs or simply default conventions. Sometimes, the end point of the circuit operation time in simulation may be implicitly identified as the last circuit operation time in simulation that any value is expected in the checking function.

There are many ways to represent constraints (or dependencies) in levels of test bench 110. All these ways assure that the values of certain wires are among certain desired combinations. In other words, all these ways assure certain logic relationships among these values with certain predefined degrees of freedom. In some of these ways, the degrees of freedom are generally provided by a set of wild card values of some wires, and the logic relationships between the values to be constrained are provided by functions mapping from these wild card values to the values to be constrained. In some others of these ways, a set of wild card values of some wires provides more combinations than the desired combinations, and a function identifying the undesired combinations is provided to keep the checking function from checking any consequences of these undesired combinations. The function identifying the undesired combinations can be connected directly to the checking function, or it can be connected directly to the end point of the circuit operation time in simulation.

Figure 2:
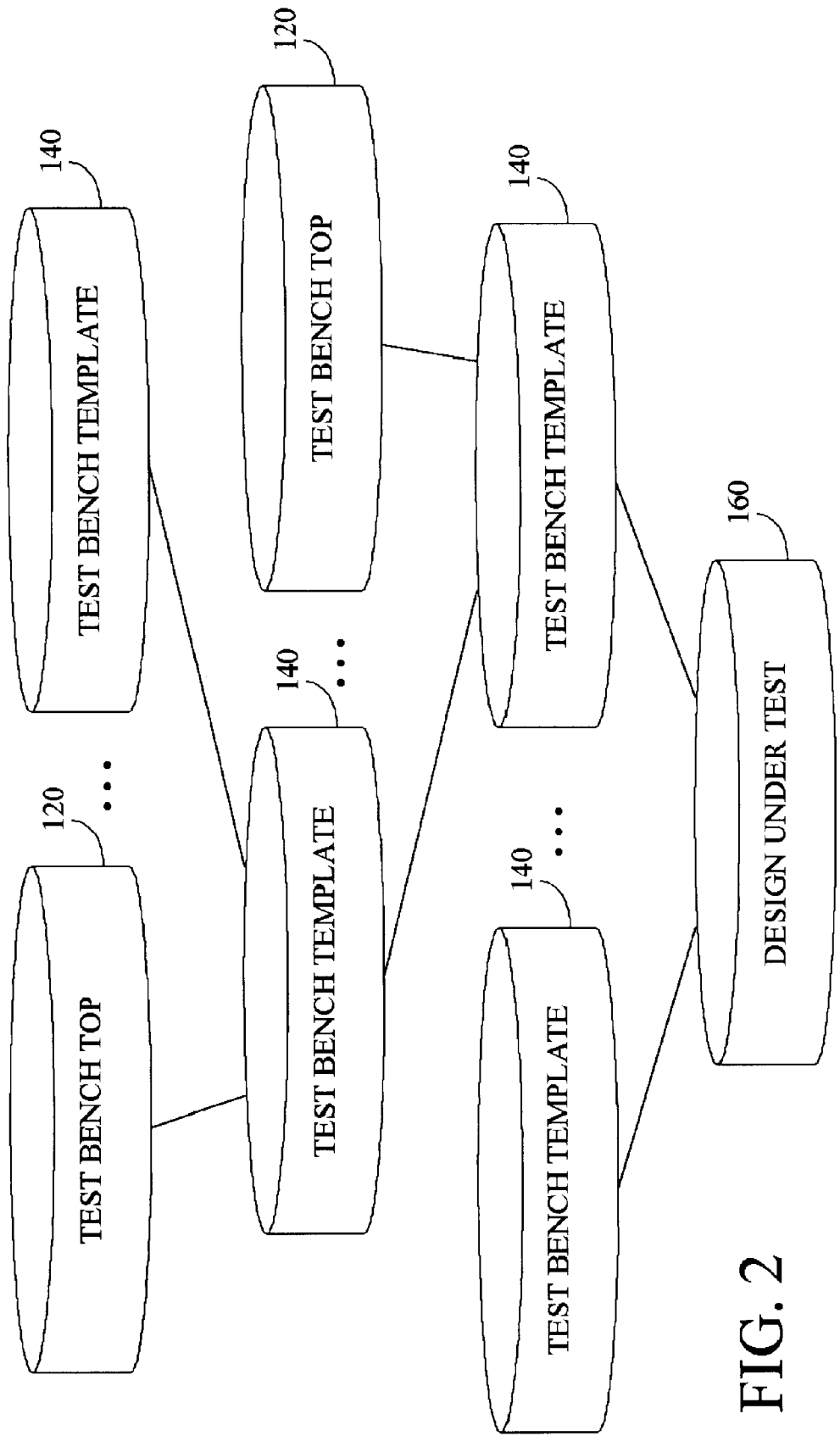
FIG. 2 illustrates, in block diagram form, an example tree structure of several test benches.

FIG. 2 illustrates many test bench templates 140 and test bench tops 120 that are used to verify design under test 160. Each of them can be used to verify a different feature of design under test 160. One additional level of them can be used to verify a more restricted part of a feature. Each path from a test bench top 120 to design under test 160 is a test bench 110. It also shows some paths without test bench tops 120.

Using a tree structure of test bench templates 140 and test bench tops 120, as illustrated in FIG. 2, is a way to divide the overall verification task for design under test 160. If a module at a higher level is connected to another module at a lower level, the module at the higher level covers a part of the functional correctness covered by the module at the lower level. If several modules at a higher level are connected to the same module at a lower level, the modules at the higher level cover several parts of the functional correctness covered by the module at the lower level. These parts may or may not overlap with each other, and they may or may not jointly cover completely the functional correctness covered by the module at the lower level. Generally they are not desired to overlap. Complete coverage is generally desirable but a compromise is often needed for reasons such as resource limitations.

Higher levels can be added or removed depending on what are used as inputs to hybrid analysis 600, symbolic analysis 500, exhaustive simulation 400, pseudo-random simulation 300 or directed simulation 200. Adding a higher level is desirable when a shorter turn-around time is desirable. Removing a higher level is needed when a wider coverage per verification run is preferred. Many factors may influence these decisions, including the features of the verification tools and the features of design under test 160.

These levels can be in different languages, in different formats, or in different styles. These representation attributes and other non-functional attributes may or may not be associated with certain functional attributes. These attributes may also indicate certain choices in the roles that they play in hybrid analysis 600, symbolic analysis 500, exhaustive simulation 400, pseudo-random simulation 300 or directed simulation 200.

Figures 3, 4:
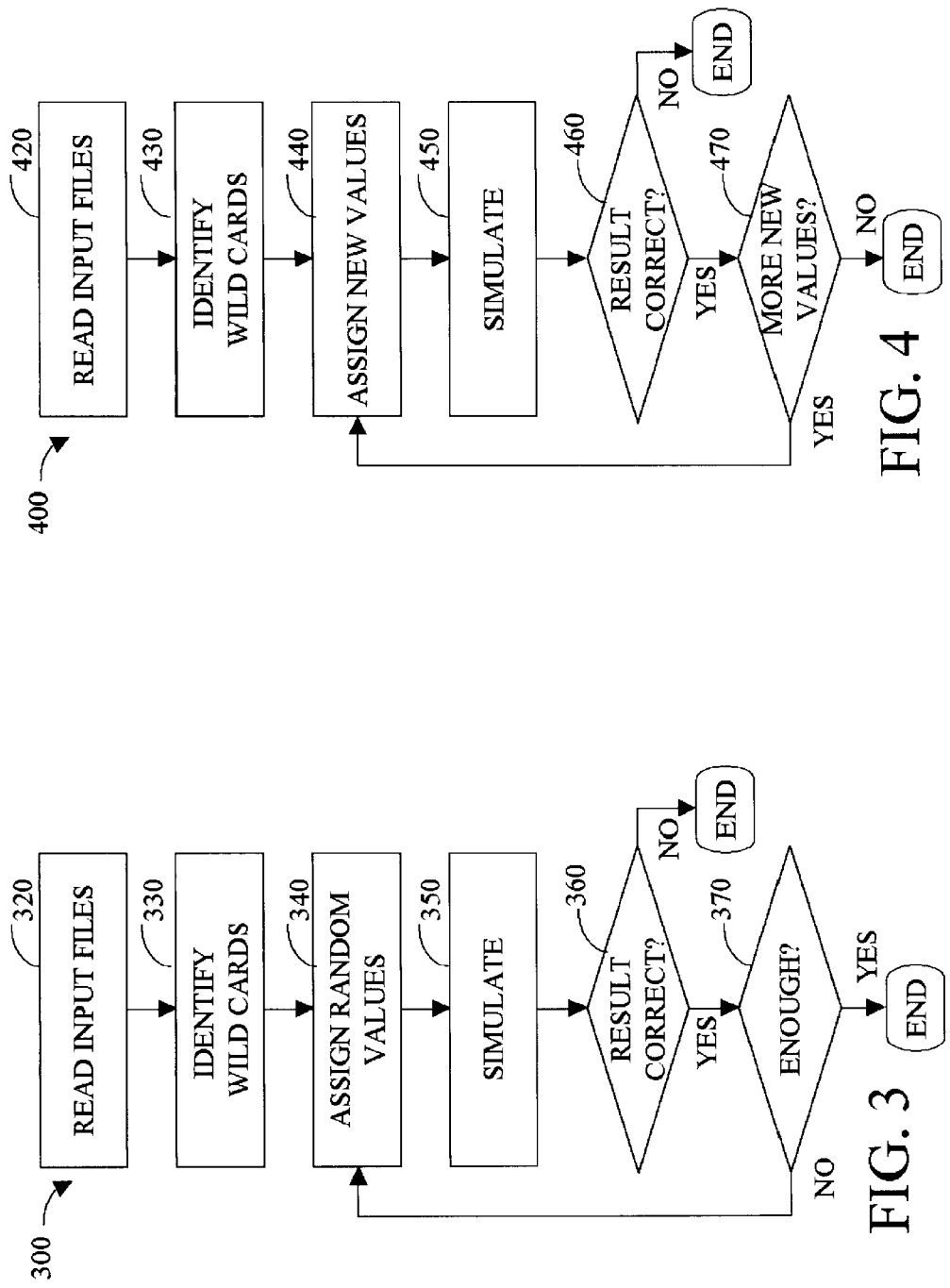
FIG. 3 illustrates, in flow diagram form, a pseudo-random simulation process for utilizing a test bench template.
FIG. 4 illustrates, in flow diagram form, an exhaustive simulation process for utilizing a test bench template.

FIG. 3 shows more details of pseudo-random simulation 300. After an initial step 320 of reading design under test 160 and test bench template 140 from files, a step 330 is performed to identify all the wild cards. If an independent signal value can be interpreted as neither 1 nor 0, it is a wild card for the initial value of a memory element or a series of wild cards for the value of any other signal. The total circuit operation time in simulation needs to be identified because the number of wild cards in each of such series is the total number of basic time units in the total circuit operation time in simulation. In a preferred embodiment, the basic time unit is a clock cycle.

After step 330 there is a step 340 of assigning a pseudo-random binary value to each wild card. All independent values in design under test 160 and test bench template 140 are 0's and 1's after step 340. Then a step 350 of binary simulation is performed. The simulation result of step 350 is checked in a step 360 based on the checking function in test bench template 140. If the simulation result is incorrect, pseudo-random simulation 300 terminates with the pseudo-random values of all wild cards saved in test bench top 120 for further debugging. If the simulation result is correct, a step 370 is performed to decide whether any more iteration is needed. If needed, the sequence of steps 340, 350, 360 and 370 is repeated with a new set of pseudo-random binary values. If not needed, pseudo-random simulation 300 terminates with a correct result.

FIG. 4 shows more details of exhaustive simulation 400. It starts with a step 420 of reading files and a step 430 of identifying wild cards in design under test 160 and in test bench template 140. Step 420 and step 430 are the same as step 320 and step 330 respectively. A step 440 follows to assign a set of binary values to all wild cards while assuring this set will never be repeated in future iterations. In a preferred embodiment, each wild card is represented by a bit in a binary number. Selecting the binary numbers of these bits sequentially will avoid repeating any set of binary values in a preferred embodiment.

A step 450 of binary simulation and a step 460 of correctness decision are performed following step 440, and they are the same as step 350 and step 360 respectively. If the simulation result is decided to be incorrect in step 450, exhaustive simulation 400 terminates with the current values of all wild cards saved in test bench top 120 for further debugging. If the simulation result is correct, a step 470 is performed to decide whether there is any more set of binary values of wild cards. If the answer is yes, the sequence of steps 440, 450, 460 and 470 is repeated with the next set of binary values of wild cards. If the answer is no, exhaustive simulation 400 terminates with a correct result.

Figure 5:
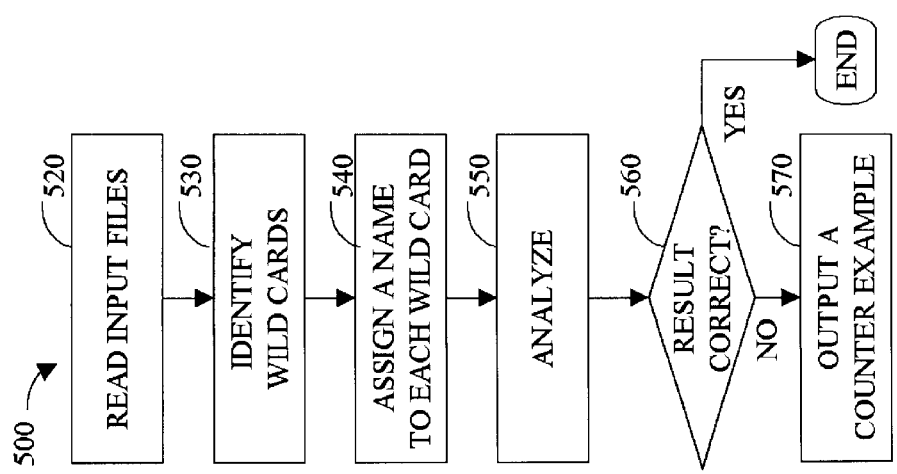
FIG. 5 illustrates, in flow diagram form, a symbolic analysis process for utilizing a test bench template.

FIG. 5 shows more details of symbolic analysis 500. It starts with a step 520 of reading files and a step 530 of identifying wild cards in design under test 160 and in test bench template 140. Step 520 and step 530 are the same as step 320 and step 330 respectively.

A step 540 is performed to give names to all wild cards after step 530. The names of different wild cards must be different from one another. If a wild card represents the initial value of a memory element, the name of the wild card may include the name (with its position in the module hierarchy) of this memory element for easy correlation. If a series of wild cards represents a signal's default value, the name of each wild card in the series may include the signal's name (with its position in the module hierarchy) and the circuit operation time in simulation. If a series of wild cards represents a non-binary constant, the name of each wild card in the series may include, in addition to the circuit operation time in simulation, the constant's location in the source code files (of design under test 160 or of test bench template 140) and the position in the module hierarchy where the constant is. If a constant's name is X, obviously many other constants may share the same name. The code location of a constant is not enough because the same code segment may be reused many times. If a constant (or a signal) represents many bits, different names are required for different bits. It is also possible to use numbers as any of these names.

The names from step 540 represent the wild cards as symbolic Boolean variables because a next step 550 treats design under test 160 and test bench template 140 as Boolean equations of these variables. Step 550 analyzes these equations to evaluate the output of the checking function in test bench template 140. In a preferred embodiment, my method described in patent application Ser. No. 09/257148 is used for step 550. A step 560 is the next to examine the result of step 550. If the result is correct, symbolic analysis 500 terminates with a correct result. If it is not correct, test bench top 120 is generated, in a step 570, with a set of binary values of the wild cards to show, in directed simulation 200, how the incorrect result happens.

Figure 6:
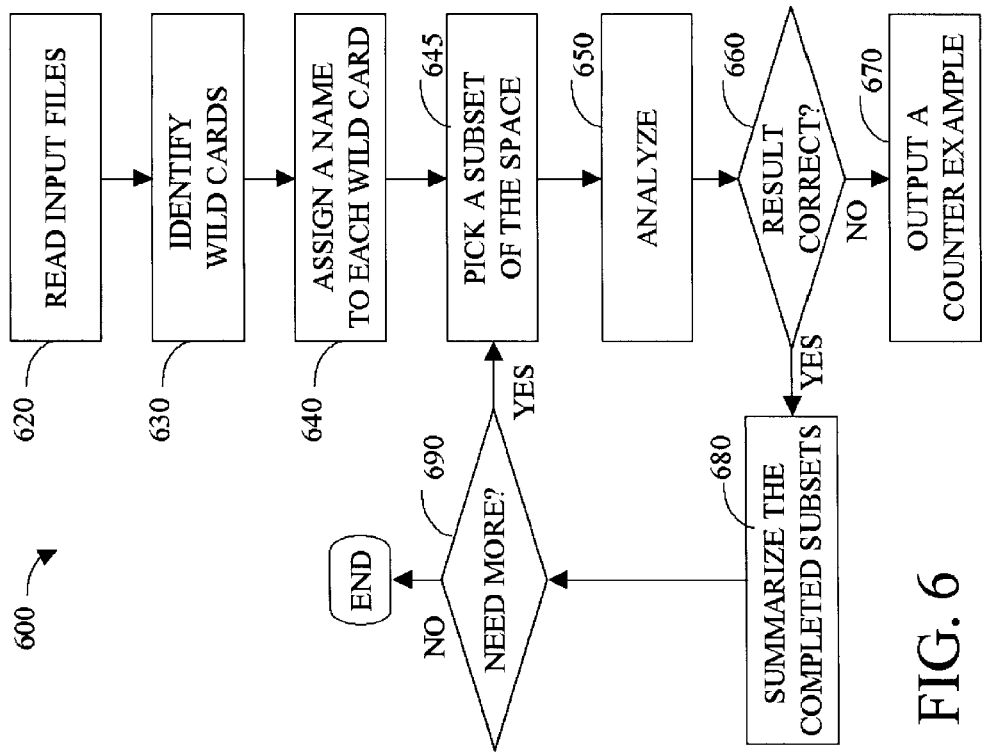
FIG. 6 illustrates, in flow diagram form, a hybrid analysis process for utilizing a test bench template.

FIG. 6 shows more details of hybrid analysis 600. It starts with a step 620 of reading files and a step 630 of identifying wild cards in design under test 160 and in test bench template 140. Step 620 and step 630 are the same as step 320 and step 330 respectively. A step 640 is performed to give names to all wild cards after step 630. Step 640 is the same as step 540.

The names from step 640 represent the wild cards as symbolic Boolean variables because next steps 645 and 650 treat design under test 160 and test bench template 140 as Boolean equations of these variables. Step 645 adds a group of Boolean equations of these variables, and these equations reduce the degrees of freedom, which are provided by these variables. The simplest ones of these added Boolean equations simply assign constants to some of these variables. Step 645 is equivalent to automatic generation of one additional level of test bench template 140, and it can be performed in a different form before step 640 if desired. Generally it is desirable to perform this step late so that the loop is as small as possible.

Step 650 then analyzes all these equations to evaluate the output of the checking function in test bench template 140. In a preferred embodiment, my method described in patent application Ser. No. 09/257148 is used for step 650. A step 660 is the next to examine the result of step 650. If it is not correct, test bench top 120 is generated, in a step 670, with a set of binary values of the wild cards to show, in directed simulation 200, how the incorrect result happens. Steps 650, 660 and 670 can be the same as steps 550, 560 and 570 respectively.

If the result is correct according to step 660, a step 680 follows to generate a summary of the equations added in step 645 of all iterations so far. If a combination of the Boolean variables' values can satisfy the equation group added in step 645 of any iteration so far, it must also satisfy the equation group in this summary. This summary can simply include one equation stating that at least one of the equation group added in step 645 of any previous or current iteration must be satisfied. This summary can be optionally saved in the form of a new test bench template 140, and this summary provides the constraints on the values combinations of the symbolic Boolean variables from step 640. This summary can be used for functional coverage checking later.

This summary is used in a step 690 to decide whether any more iteration is needed to cover more value combinations of the symbolic Boolean variables resulted from step 640. If there is no more combination to cover, hybrid analysis 600 terminates with a correct result. Otherwise, step 645 is performed to replace the added equation group from the previous iteration with a new equation group before going on to other steps of the new iteration.

It is possible to move some operations of step 660 before the loop. This will make the process more efficient. One approach to achieve this higher efficiency is to use my method described in patent application Ser. No. 09/257148, now U.S. Pat. No. 6,339,837, with my method described in patent application Ser. No. 09/531633 as its tautology checking engine.

Figure 7:
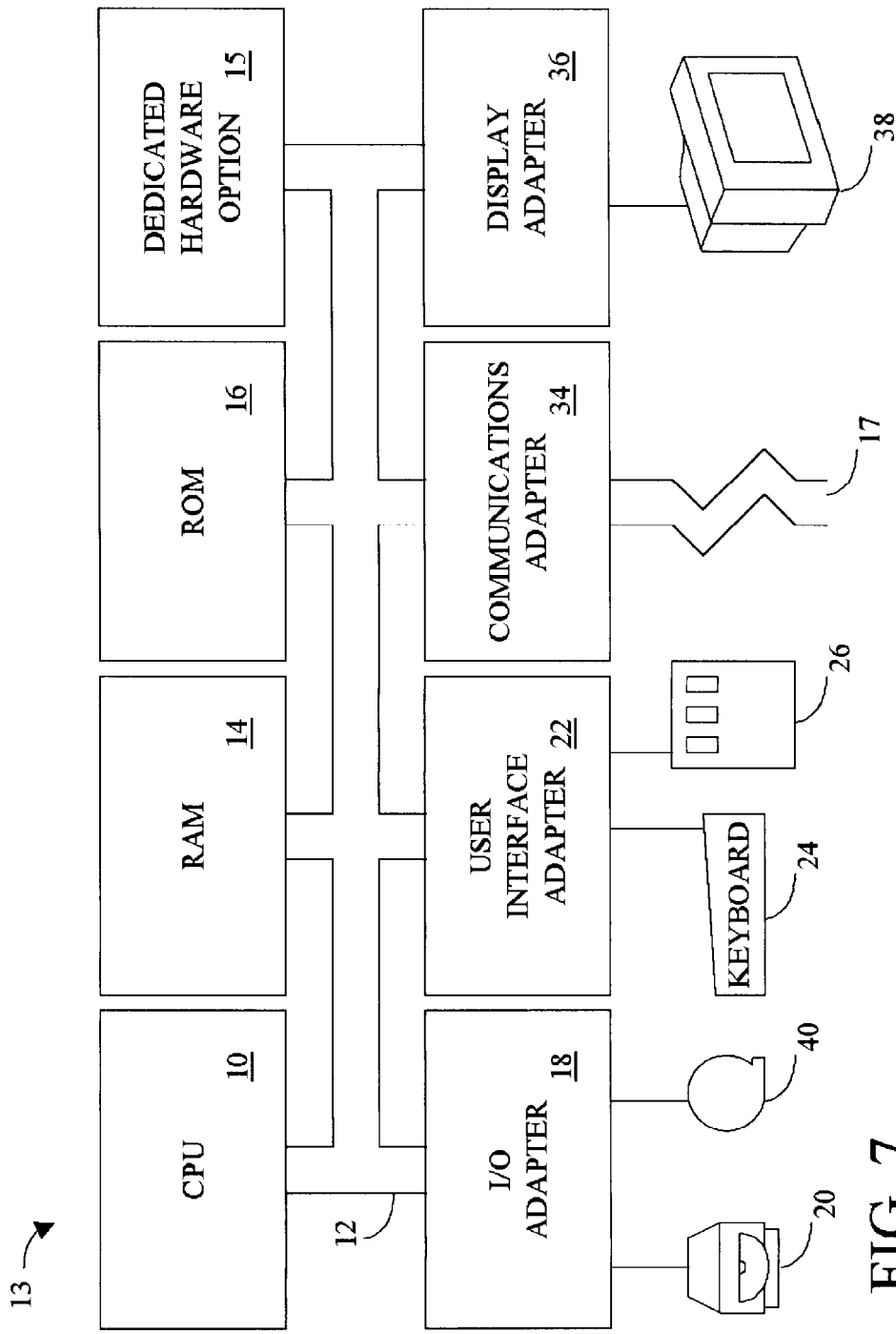
FIG. 7 illustrates a block diagram for computer system in accordance with the present invention.

The invention discussed above may be implemented within dedicated hardware 15 as illustrated in FIG. 7 or within processes implemented within a data processing system 13. A typical hardware configuration of a workstation, that may be implemented to accomplish the method disclosed herein, is illustrated and includes a central processing unit (CPU) 10, such as a conventional microprocessor, and a number of other units interconnected via a system bus 12. The workstation shown in FIG. 7 includes random access memory (RAM) 14, read only memory (ROM) 16, and input/output (I/O) adapter 18 for connecting peripheral devices, such as disk units 20 and tape units 40, to bus 12. A user interface adapter 22 is used to connect a keyboard device 24 and a mouse 26 to system bus 12. Other user interface devices such as a touch screen device (not shown) may also be coupled to system bus 12 through user interface adapter 22. A communication adapter 34 is also shown for connecting the workstation to a data processing network 17. Further, a display adapter 36 connects system bus 12 to a display device 38.

The method of the present invention may be implemented and stored in one or more of disk units 20, tape drive 40, ROM 16 and/or RAM 14, or even made available to system 13 via network 17 through communication adapter 34 and thereafter processed by CPU 10. Since the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 8:
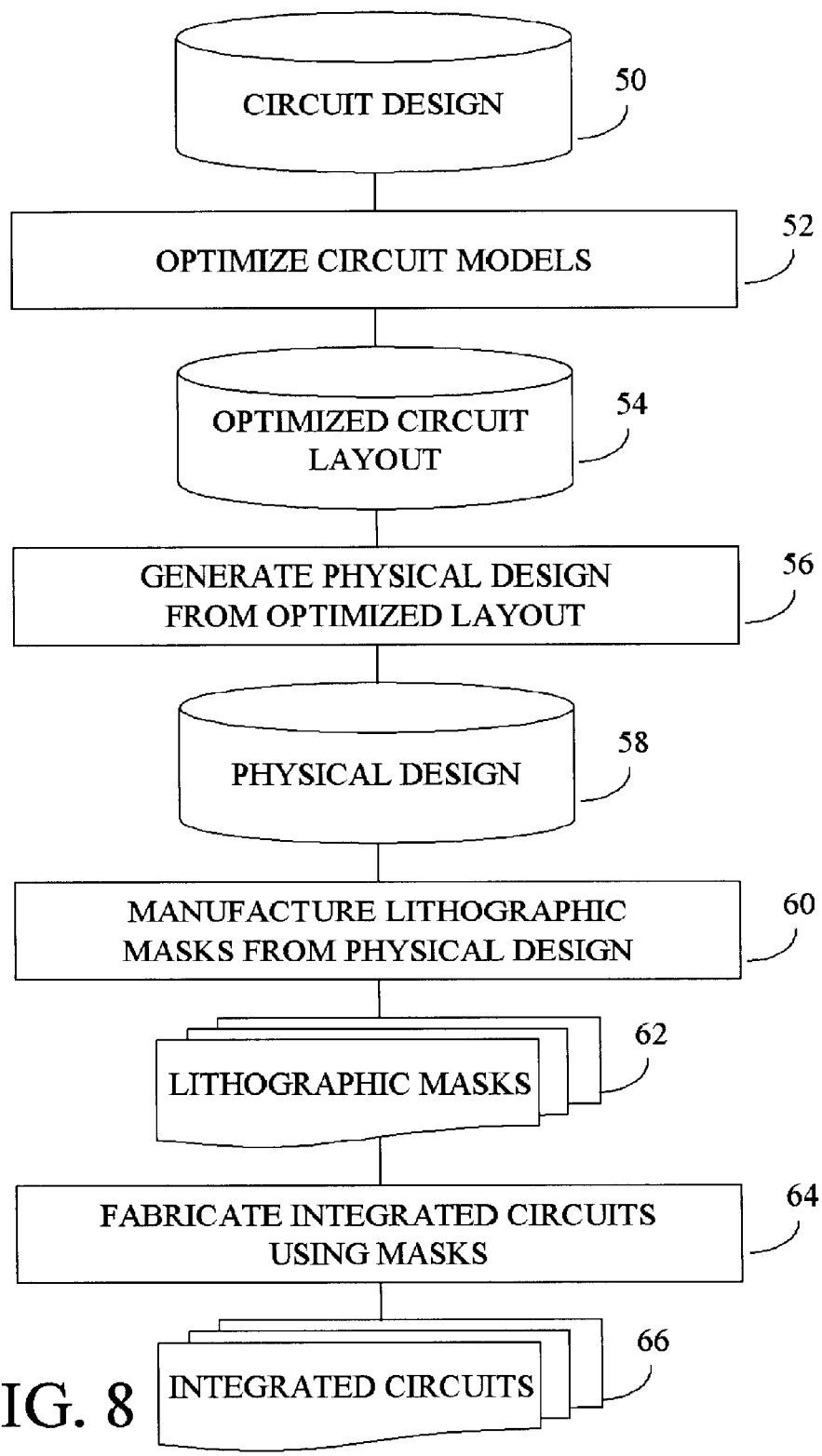
FIG. 8 illustrates a flow diagram for processing circuit designs in accordance with the present invention.

FIG. 8 is a block diagram that illustrates integrated circuit fabrication utilizing the correct circuit design resulting from using this verification method. An optimization tool 52 utilizes a circuit design 50 to generate an optimized circuit layout 54. A physical design file 58 is generated 56 from optimized circuit layout 54. Circuit design 50, optimized circuit layout 54, and physical design 58 are typically stored as data files on computer readable media such as disk units 20. Physical design file 58 includes integrated circuit dimensions, element dimensions, and element locations within the integrated circuit. Physical design file 58 locates elements and connections within a two-dimensional substrate area of an integrated circuit die. Preferably, physical design file 58 includes physical structure for performing the functions of an integrated circuit design from which physical design file 58 was derived. Physical design file 58 is converted 60 into a set of lithographic masks 62 corresponding to layers in the physical design file 58. Lithographic masks 62 are used to fabricate 64 integrated circuits 66.

The method taught herein are used to generate CAD (computer aided design) data files which contain information regarding an integrated circuit and placement of gates, transistors, and the like in the integrated circuit. Specifically, the present invention can be used when generating these files. These files are used to form lithographic masks that are then used to form a plurality of integrated circuits on a plurality of wafers using an integrated circuit fabrication facility. The uses of these files and masks are known to those skilled in the art.

While the above invention has been described with reference to certain preferred embodiments, the scope of the present invention is not limited to these embodiments. One skilled in the art may find variations of these preferred embodiments which, nevertheless, fall within the spirit of the present invention, whose scope is defined by the claims set forth below.

I claim:

1. A method for verification of a design, using a test bench template comprising one or more levels, comprising the steps of:

obtaining said test bench template and said design;

identifying a set of one or more wild cards in said design and in said test bench template;

processing said design and said test bench template based on said set of one or more wild cards; and adjusting said test bench template by adding, removing or replacing one or more levels before repeating all steps after the step of obtaining, whereby said design is driven differently in each iteration and/or the behavior of said design is observed differently in each iteration.

2. A method for verification of a design as in claim 1, wherein the step of processing comprising of the step of:

turning one or more members of said set of one or more wild cards into members of a set of one or more symbolic Boolean variables.

3. A method for verification of a design as in claim 2, wherein the step of processing further comprising of the step of:

analyzing said design and said test bench template based on said set of one or more symbolic Boolean variables, whereby the result shows whether the design is functional correct with respect to the test bench template.

4. A method for verification of a design as in claim 3, wherein the step of processing further comprising of the step of:

adding, before the step of analyzing, one or more Boolean equations of said set of one or more symbolic Boolean variables, whereby constraints become more restricted, by joining the added Boolean equations with the Boolean equations from both the test bench template and the designs as to make the step of analyzing easier to perform.

5. A method for verification of a design as in claim 4, wherein the step of processing further comprising of the steps of:

summarizing said one or more Boolean equations added in all the previously executed steps of adding, whereby the resulted summary helps determining the completion point; and determining, based on the result of the last step of summarizing, whether to replace said one or more Boolean equations added in the last step of adding with different Boolean equations of said set of one or more symbolic Boolean variables before repeating the step of analyzing, whereby the constraints are kept changing for each iteration of the step of analyzing until completion.

6. A method for verification of a design as in claim 5, further comprising of the step of:

saving the result of the step of summarizing as an additional level of said test bench template, whereby functional coverage analysis is performed using said test bench template with the additional level.

7. A method for verification of a design as in claim 1, further comprising of the steps of:

generating a test bench top; and simulating said design with said test bench top and said test bench template, whereby more Information is generated for debugging purposes.

8. A method for verification of a design as in claim 1, wherein said set of one or more wild cards includes initial values of one or more memory elements in said design.

9. A method for verification of a design as in claim 1, wherein said set of one or more wild cards includes initial values of one or more memory elements in said test bench template.

10. A method for verification of a design as in claim 1, wherein said set of one or more wild cards includes default values of a set of one or more wires at one or more circuit operation times.

11. A method for verification of a design as in claim 10, wherein the default value of each member of said set of one or more wires at each circuit operation time is a different member of said set of one or more wild cards.

12. A method for verification of a design as in claim 10, wherein each member of said set of one or more wires is not connected to any source.

13. A method for verification of a design as in claim 10, wherein one or more members of said set of one or more wires are in said design.

14. A method for verification of a design as in claim 10, wherein one or more members of said set of one or more wires are in said test bench template.

15. A method for verification of a design as in claim 1, wherein said set of one or more wild cards includes values of members of a set of one or more constants at circuit operation times, whereby special constants, including unknowns, are interpreted.

16. A method for verification of a design as in claim 15, wherein the value of each member of said set of one or more constants at each circuit operation time is a different member of said set of one or more wild cards.

17. A method for verification of a design as in claim 15, wherein one or more members of said set of one or more constants are in said design.

18. A method for verification of a design as in claim 15, wherein one or more members of said set of one or more constants are in said test bench template.

19. A method for verification of a design, using a test bench template, comprising the steps of:

obtaining said test bench template and said design;

identifying a set of one or more wild cards in said design and in said test bench template;

turning one or more members of said set of one or more wild cards into members of a set of one or more symbolic Boolean variables;

adding one or more Boolean equations of said set of one or more symbolic Boolean variables, whereby constraints become more restricted, by joining the added Boolean equations with the Boolean equations from both the test bench template and the design, as to make the next step easier to perform; and analyzing said one or more Boolean equations with said design and said test bench template, based on said set of one or more symbolic Boolean variables, whereby the result shows whether the design is functional correct with respect to the test bench template and the added Boolean equations.

* * * * *